United States Patent [19]

Nogami

[11] Patent Number: 5,379,246
[45] Date of Patent: Jan. 3, 1995

[54] SEMICONDUCTOR MEMORY DEVICE HAVING LOOP CONFIGURATION

[75] Inventor: Kazutaka Nogami, Palo Alto, Calif.

[73] Assignee: Kabushiki Kaisha Toshiba, Kawasaki, Japan

[21] Appl. No.: 123,224

[22] Filed: Sep. 20, 1993

[30] Foreign Application Priority Data

Sep. 21, 1992 [JP] Japan .................................. 4-251393

[51] Int. Cl.⁶ ................................................ G11C 7/00
[52] U.S. Cl. ...................................... 365/51; 365/154; 257/903
[58] Field of Search ............... 257/211, 903, 904, 908; 365/51, 154

[56] References Cited

U.S. PATENT DOCUMENTS 4,872,142 10/1989 Hannai ..................................... 365/51
5,008,728 4/1991 Yamamura et al. .................. 257/211
5,122,857 6/1992 Ikeda ..................................... 257/903

Primary Examiner—Robert P. Limanek
Attorney, Agent, or Firm—Finnegan, Henderson, Farabow, Garrett & Dunner

[57] ABSTRACT

A semiconductor memory device includes a plurality of memory cells each specified by selecting one of rows and one of columns, a plurality of word lines to each of which the memory cells associated with selected one of the rows are connected in a branch form, for selecting the rows, and a plurality of bit lines to each of which the memory cells associated with selected one of the columns are connected in a branch form, for selecting the columns and providing data transmission paths for the memory cells, wherein at least one wiring of the word lines and bit lines constitutes part of at least one closed circuit. Thus, even if breaking of wire occurs in part of the wiring in the manufacturing process or in use, the memory device can be prevented from becoming a defective product due to the breaking of wire. As a result, high manufacturing yield and high reliability in use can be obtained.

18 Claims, 6 Drawing Sheets

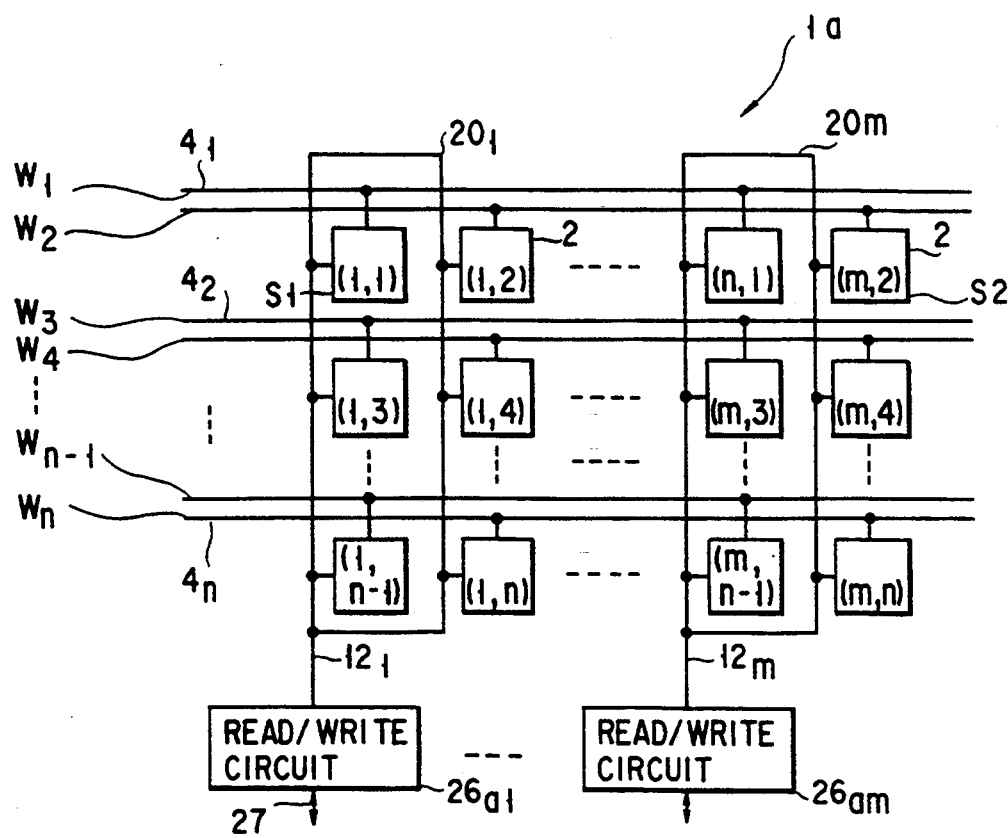
F I G. 4
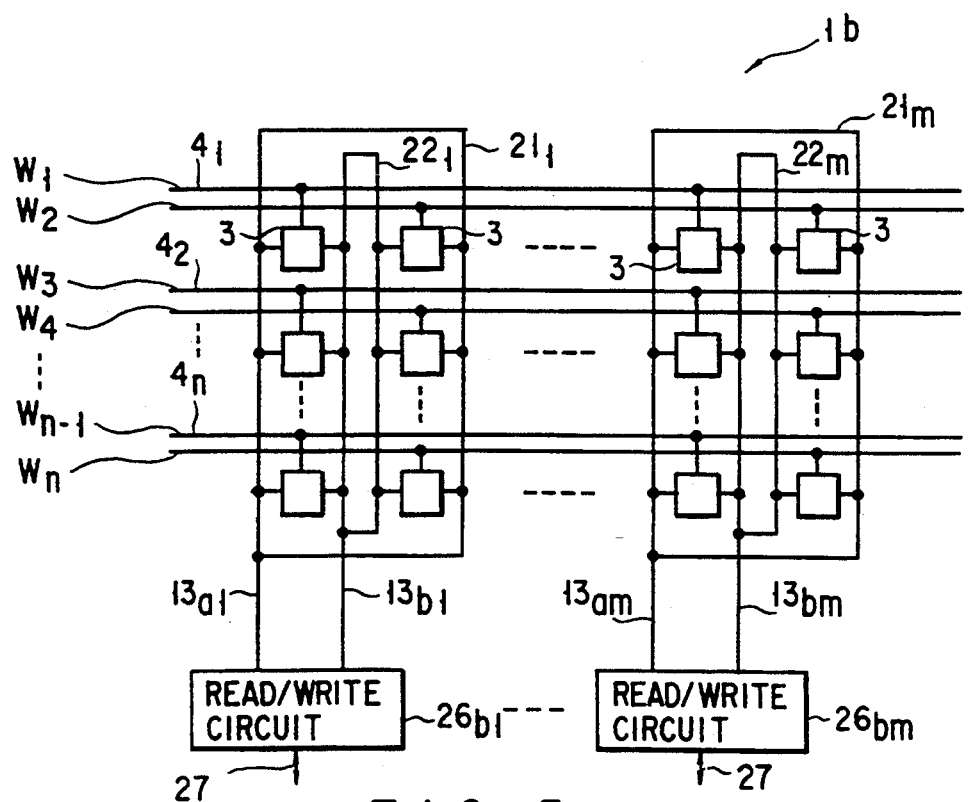
F I G. 5

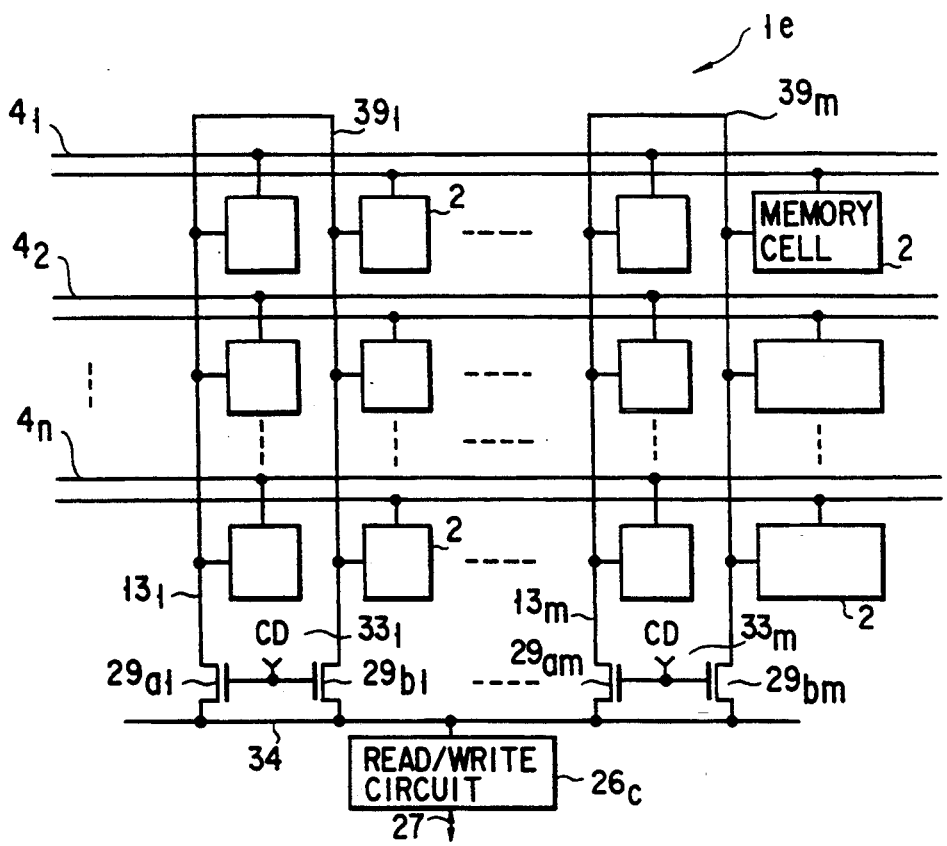
F I G. 8
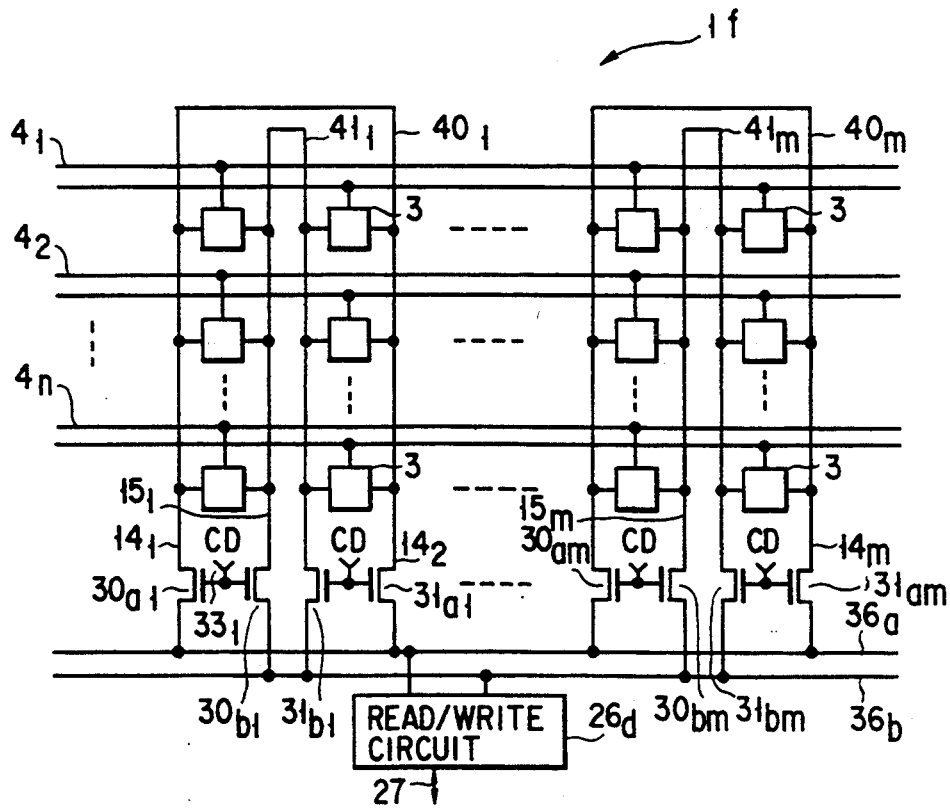
F I G. 9

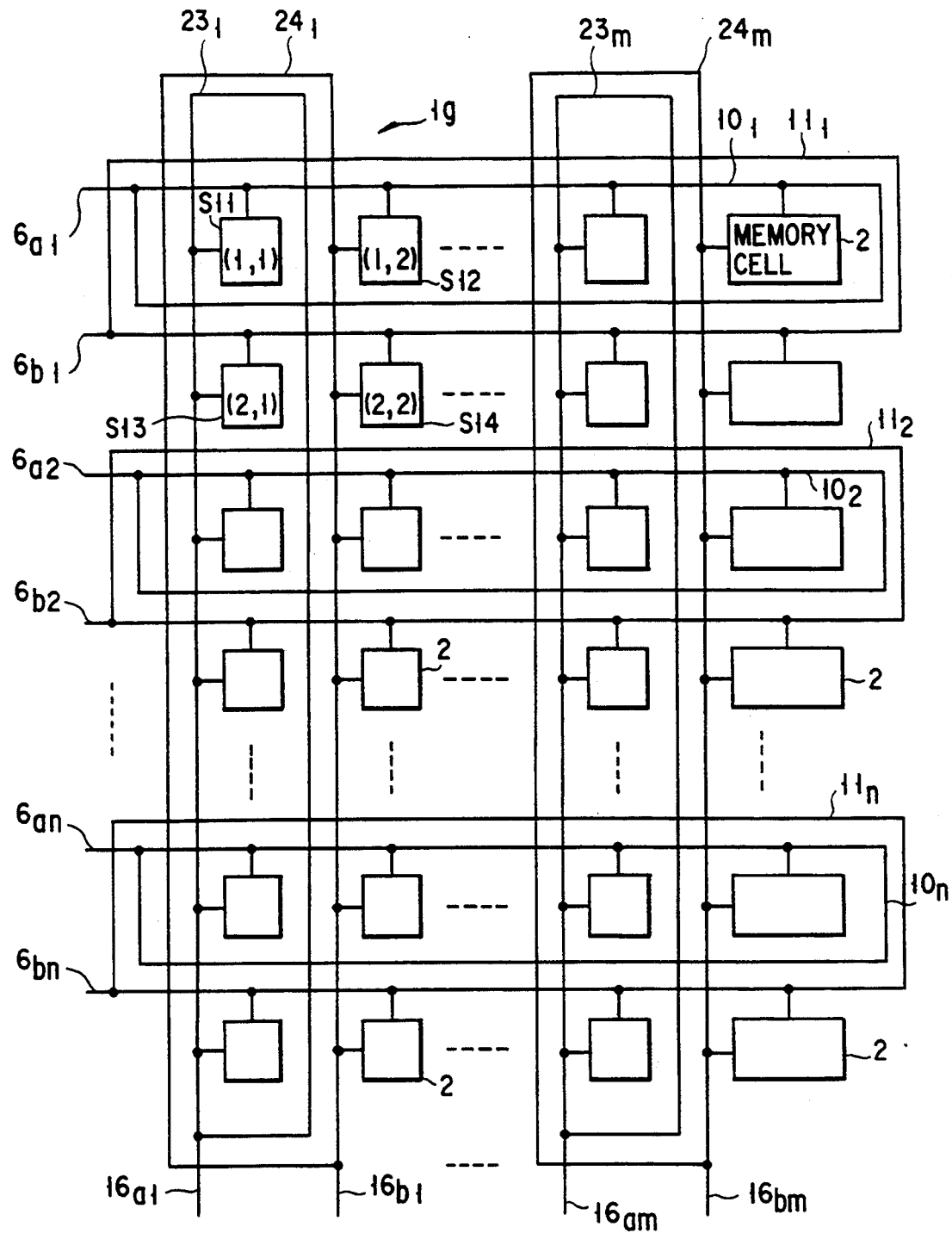
F I G. 10

SEMICONDUCTOR MEMORY DEVICE HAVING LOOP CONFIGURATION

BACKGROUND OF THE INVENTION

1. Field of the Invention

The present invention relates to a semiconductor memory device and, more particularly, to a semiconductor memory device suitably used for a large capacity memory.

2. Description of the Related Art

FIG. 1 is a circuit diagram showing the basic construction of a conventional typical semiconductor memory device. One column of the memory cell array of the conventional typical semiconductor memory device (which is referred to as a semiconductor memory hereinafter) is shown in FIG. 1. The semiconductor memory has a plurality of memory cells 2. Each of the memory cells 2 is connected in a branch form to a corresponding one of a plurality of word lines 104 and a corresponding one of a plurality of bit lines 112. The bit line 112 has not only a memory cell selecting function which is attained in cooperation with the word line, but also has a function of providing a data transmission path to the selected memory cell. Generally, the plurality of word lines 104 are arranged in parallel to extend in one direction and one ends thereof are connected to a decoder (not shown). Further, the plurality of bit lines 112 are arranged in a direction intersecting with the word lines 104 at a preset angle, for example, 90 degrees and one ends thereof are connected to a read/write circuit 26e. At the time of read/write operation, a word line and a bit line are selected by the row decoder and column decoder according to an address signal for a memory cell 2 to be accessed. Then, only a specified selected memory cell 2 that is connected to the selected single word line 104 and single bit line 112 can be accessed. The read/write circuit 26e to which one end of the bit line associated with the selected memory cell 2 is connected effects the read/write operation for the selected memory cell 2 via the bit line 112 serving as the data transmission path.

FIG. 2 is a circuit diagram showing the basic construction of another conventional semiconductor memory. Each bit line is constructed by a complementary signal line pair. Each memory cell 3 is connected to corresponding bit lines which are constructed by a pair of signal lines 113a, 113b. Transfer gates 28a, 28b are serially connected between a read/write circuit 26f and the respective bit lines 113a, 113b. Reference numerals 36a, 36b denote data lines. The read/write operation of the memory in FIG. 2 is the same as that of FIG. 1. In FIGS. 1 and 2, power sources and peripheral circuits such as a row decoder are not shown for simplifying the drawing.

As the memory capacity of the above semiconductor memory tends to be largely increased, problems clearly arise accordingly to its large capacity. Generally, breaking of wires of the semiconductor memory occurs with a certain probability. As the total length of the wire is increased with an increase in the memory capacity, the probability of occurrence of one or more breakings of the wires in one chip becomes high. Particularly, it becomes extremely difficult to manufacture memory cell arrays which do not contain breaking of bit and/or word wires at all. For example, in FIG. 1, when breaking of wire occurs on the half way of the bit line 112 which straightly extends from the read/write circuit 26e, memory cells which lie on the opposite side with respect to the breaking portion of the bit line as viewed from the read/write circuit 26e cannot be accessed. That is, defective bits occur. It should be noted that even if the defective bits is only one bit, the memory chip cannot be used at all. When the breaking of wire occurs in the manufacturing process, it becomes a main factor of low manufacturing yield. This is a serious problem for manufacturing the semiconductor memory device.

FIG. 3 is a schematic block diagram showing the construction of a semiconductor memory having a column redundant circuit additionally provided. As a means for protecting the memory chip from becoming a defective product caused by occurrence of defective bits, an additional redundant circuit is used. FIG. 3 is a conceptional diagram of a column redundant circuit used as an example of a redundant circuit. When a column redundant circuit corresponding to one column of the memory cell array is provided, the whole portion of a column of the memory array 1i to which the defective bit belongs is replaced with a spare column 56 by means of a switching circuit 58 if a defective bit is detected in the memory test. In general, a plurality of row redundant circuits and/or a plurality of column redundant circuits are prepared. However, the number of rows or columns which can be backed up by the redundant circuits is limited. Further, there are provided various types of memories in which redundant circuits cannot be easily formed because each cell thereof is not equivalent as in a cache memory or it has a limitation in the layout. Therefore, use of the redundant circuit is not sufficient to protect a memory chip from becoming a defective product caused by occurrence of a defective bit in the present state. Further, if breaking of wire due to deterioration with time such as electromigration occurs in use, an impact is given to the whole system and the reliability of the elements is degraded. It also causes a serious problem. However, in the present state, the redundant circuit has no practical effect for breaking of wire in the semiconductor memory in use and no effective recovery means can be provided. Since the memory chip is manufactured through a large number of steps, it is desired from the viewpoint of manufacturing yield to develop more effective means for preventing occurrence of defective chips even when breaking of wire has occurred. Besides, from the viewpoint of reliability, it is desired to develop means which can be effectively used not only in the manufacturing process but also at the time of use.

SUMMARY OF THE INVENTION

An object of the present invention is to provide a semiconductor memory device which will not become a defective product caused by breaking of wire even if part of the wire is broken in the manufacturing process or in service, thereby providing high manufacturing yield and high reliability in service.

According to an aspect of the present invention, there is provided a semiconductor memory device comprising a plurality of memory cells each specified by selecting one of rows and one of columns; a plurality of word lines to each of which the memory cells associated with selected one of the rows are connected in a branch form; and a plurality of bit lines to each of which the memory cells associated with selected one of the columns are connected in a branch form; wherein at least one wiring of the word lines and bit lines constitutes part of at least one closed circuit.

According to another aspect of the present invention, there is provided a semiconductor memory device comprising a plurality of memory cells each specified by selecting one of rows and one of columns, a plurality of word lines to each of which the memory cells associated with selected one of the rows are connected in a branch form; and a plurality of bit lines to each of which the memory cells associated with selected one of the columns are connected in a branch form; wherein at least one closed circuit which is constructed by forming at least one wiring of the word lines and bit lines to have an electrically closed ring-form portion is provided.

According to still another aspect of the present invention, there is provided a semiconductor memory device comprising a plurality of memory cells each specified by selecting one of rows and one of columns; a plurality of word lines to each of which the memory cells associated with selected one of the rows are connected in a branch form; first and second switching means for switching their conductivity; a plurality of bit lines each series-connected at one ends to one end of the first switching means and to each of which the memory cells associated with selected one of the columns are connected in a branch form; and a data line connected to the other end of the first switching means; wherein the other end of at least one of the bit lines is series-connected to one end of the second switching means and the other end of the second switching means is connected to the data line so that at least one closed circuit can be constructed by the bit line, the first and second switching means and the data line.

In the memory cell array, the bit line and/or word line is formed in loop configuration having a ring-form portion. Alternatively, two transfer gates connected to both ends of a U-shaped bit line are connected to the same data line so as to form a loop at the time of column selection. When the memory cell is connected in a branch form to the closed circuit containing the associated word lines, a plurality of current paths connecting the memory cell to the row decoder are provided so that the memory cell can be accessed while at least one of the current paths is active even if breaking of wire occurs in a corresponding portion of the word line. This makes it possible to prevent occurrence of a defective cell caused by the breaking of wire. Likewise, when the memory cell is connected in a branch form to the closed circuit containing the associated bit lines, a plurality of current paths connecting the memory cell to the read/write circuit are provided so that the memory cell can be accessed while at least one of the current paths is active even if breaking of wire occurs in a corresponding portion of the bit line, thereby making it possible to prevent occurrence of a defective cell caused by the breaking of wire.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention, and together with the general description given above and the detailed description of the preferred embodiments given below, serve to explain the principles of the present invention.

FIG. 4 is a schematic construction diagram of a memory cell array according to a first embodiment of the present invention in which a bit line has a ring-form portion;

FIG. 5 is a schematic construction diagram of a memory cell array according to a second embodiment of the present invention in which a bit line constructed by a complementary signal line pair has a ring-form portion;

FIG. 8 is a schematic construction diagram of a memory cell array according to a fifth embodiment of the present invention in which a closed circuit is formed of a bit line, first and second transfer gates and a data line;

FIG. 9 is a schematic construction diagram of a memory cell array according to a sixth embodiment of the present invention in which a bit line is constructed by a complementary signal line pair and a closed circuit is formed of each bit line, first and second transfer gates and a data line;

FIG. 10 is a schematic construction diagram of a memory cell array according to a seventh embodiment of the present invention in which a word line and a bit line each have a ring-form portion;

DETAILED DESCRIPTION OF THE PREFERRED EMBODIMENTS

Figure 1:
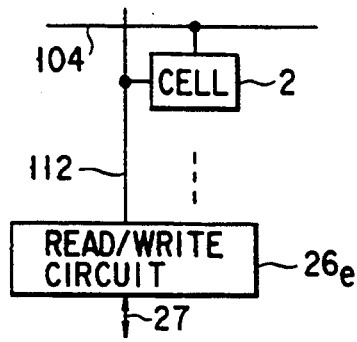
FIG. 1 is a circuit diagram showing the basic structure of a conventional typical semiconductor memory.
Figure 2:
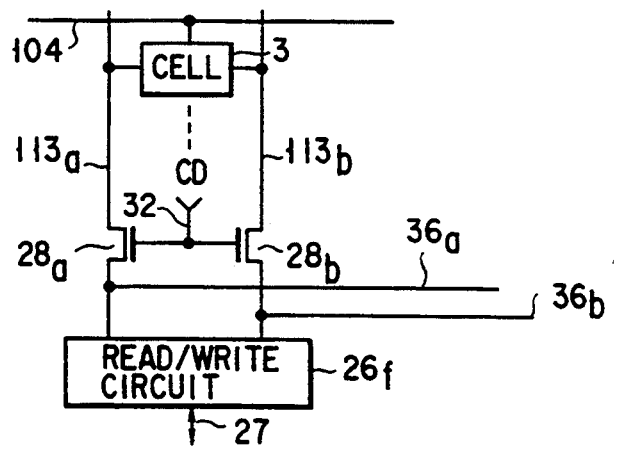
FIG. 2 is a circuit diagram showing the basic structure of another conventional typical semiconductor memory.

There will now be described embodiments of a semiconductor memory device according to the present invention with reference to the accompanying drawings.

FIG. 4 is a schematic construction diagram of a memory cell array according to a first embodiment of the present invention. The schematic construction of a memory cell array 1a is shown in which a plurality of memory cells 2, word lines 4, bit lines 12, and read/write circuits 26a are regularly arranged. A plurality of word lines 4 extend in a lateral direction in FIG. 4. The bit line 12 extends from the read/write circuit 26 in a vertical direction in FIG. 4 and is branched into two portions on the half way. The two branched portions further extend in a vertical direction while crossing the word lines 4, and connected together after crossing the last word line $4_l$. That is, the bit line 12 is formed in a ring form. N memory cells among the total memory cells 2 are connected to each bit line, where n=(total number of memory cells)/(total number of bit lines). Half of the n memory cells 2 are arranged inside the ring-form portion 20 of the bit line 12 and connected to the branched bit line lying on the left side of the ring-form portion 20. The remaining half of the memory cells 2 are arranged outside the ring-form portion 20 and connected to the branched bit line lying on the right side of the ring-form portion 20. Since each memory cell 2 is connected to the ring-form portion 20, each memory cell 2 has two current paths leading to the read/write circuit 26a. Further, n memory cells 2 are respectively separately connected to different word lines 4. Since n memory cells 2 are arranged on two columns, the word lines 4 are arranged in such a pattern that two word lines constitute one word line set. The layout patterns of m sets which are the same as that described above are regularly arranged in a lateral direction in FIG. 4, where m=(total number of memory cells)/(total number of word lines). One of the memory cells 2 to be accessed is selected by a different combination of one of the word lines 4 and one of the bit lines 12. For example, a memory cell s1 is selected by a combination of the first word line w1 and the first bit line $12_l$, and a memory cell s2 is selected by a combination of the second word line w2 and the m-th bit line $12_m$. At the time of read operation, the read/write circuit 26a reads data from a selected memory cell 2 via the bit line 12 and outputs the data to a data input/output signal line 27. Further, at the time of write operation, the read/write circuit 26a fetches data from the data input/output signal line 27 and writes the data into the selected memory cell 2 via the bit line 12.

When the bit line 12 is formed in a ring form, an advantage can be attained that the memory function will not be influenced even if breaking of wire occurs in the bit line 12 at one portion inside the ring. This is because the bit line 12 has the ring-form portion 20. More specifically, one of the two current paths which lead to the read/write circuit 26a and to which the individual memory cells 2 are connected before the breaking occurs in the bit line 12 is lost since the ring-form portion is opened by the breaking in the bit line 12, but the other current path can still be used as an active current path between the memory cells 2 and the read/write circuit 26a. Therefore, even if the breaking occurs only in one portion of the ring-form portion of the bit line 12, the memory cell 2 associated with the bit line 12 can be accessed. Further, as long as the breaking of wire occurs only in one portion for each bit line 12, the memory function can be maintained even if a plurality of breakings of wire occur in different bit lines 12.

The same reference numerals are attached to portions which are used in respective drawings indicating other embodiments and are the same as those used in the above embodiment and the detail explanation therefor is omitted.

FIG. 5 is a block diagram showing the schematic construction of a second embodiment of the present invention. In FIG. 5, the schematic construction of a memory cell array 1b is shown in which a plurality of memory cells 3, word lines 4, bit lines 13a, 13b and read/write circuit 26b are regularly arranged. In the second embodiment, the memory cell 3 has a complementary signal line pair like a memory cell in an SRAM. Every two bit lines constitute one bit line set. The plurality of word lines 4 extend in a lateral direction in FIG. 5. A pair of bit lines 13a, 13b extend from the read/write circuit 26 in a vertical direction in FIG. 5 and are converted into a ring form on the half way. The ring-form portion 22 of the bit line 13b is disposed inside the ring-form portion 21 of the bit line 13a. Half of the memory cells 3 associated with the bit lines 13a, 13b are disposed between the left-side portion of the ring-form portion 21 of the bit line 13a and the left-side portion of the ring-form portion 22 of the bit line 13b. The remaining half of the memory cells 3 are disposed between the right-side portion of the ring-form portion 21 and the right-side portion of the ring-form portion 22. The memory cells 3 are connected in a branch form to the respective bit lines 13a, 13b. Each of the memory cells 3 has two current paths leading to the read/write circuit 26 for each bit line 13. The memory cells 3 are connected in a branch form to the respective word lines 4. One of the memory cells 3 to be accessed is selected by a different combination of one of the word lines 4 and one set of the bit lines 13a, 13b. The read/write circuit 26 reads or writes data from or into the memory cell 3 by simultaneously using the bit lines 13a and 13b.

In a case where the bit line is formed in a ring form, an advantage can be obtained that the memory function is not influenced even when breaking of wire occurs in one portion of the ring of each bit line 13a or 13b. Like the first embodiment of the present invention, when breaking of wire occurs in the bit line 13a or 13b only in one portion of the ring, a current path is still provided between the memory cell 3 and the read/write circuit 26 and, therefore, the memory cell 3 associated with the bit lines 13a, 13b can be accessed. Further, as long as the breaking of wire occurs only in one portion for each bit line 13a or 13b, the memory function can be maintained even if a plurality of breakings of wire occur in different bit lines 13a or 13b.

Figure 6:
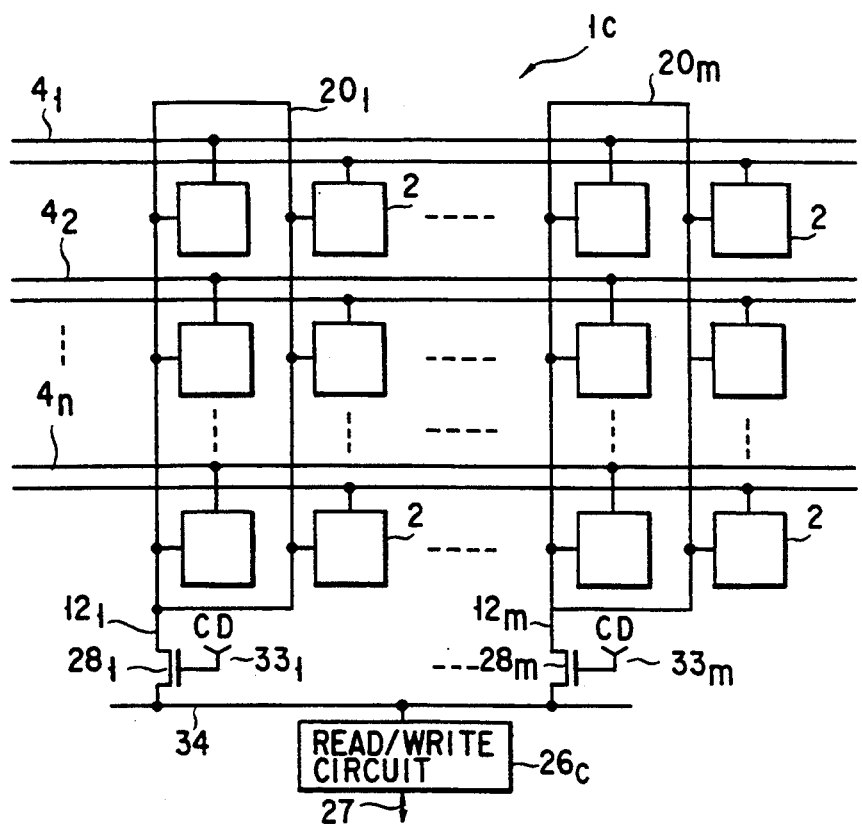
FIG. 6 is a schematic construction diagram of a memory cell array according to a third embodiment of the present invention in which a bit line connected to a read/write circuit via a transfer gate and data line has a ring-form portion.

FIG. 6 is a block diagram showing the schematic construction of a third embodiment of the present invention. In the third embodiment, a transfer gate 28 and a data line 34 are used to connect the bit line 12 to the read/write circuit 27. Also, in this case, like the first embodiment in FIG. 4 of the present invention, the bit line 12 has the ring-form portion 20, but instead of directly connecting the bit lines 12 to the respective read/write circuits 26c, one ends of the bit lines 12 are connected to one ends of respective transfer gates 28. The other ends of the transfer gates 28 are connected through a single data line 34 to the read/write circuit 26c. Since a plurality of memory cells 2 are connected to the single read/write circuit 26c, one of the transfer gates 28 which is associated with a memory cell 2 to be accessed is made conductive by a signal 33 from a column decoder (not shown) when the memory cell 2 is accessed. The read/write circuit 26 reads or writes data from or into the memory cell 2 via a current path constructed by the bit line 12, transfer gate 28 set in the conductive state, and data line 34.

Also, in the third embodiment, the same advantage can be attained by the same operation as that of the first embodiment of the present invention.

Figure 7:
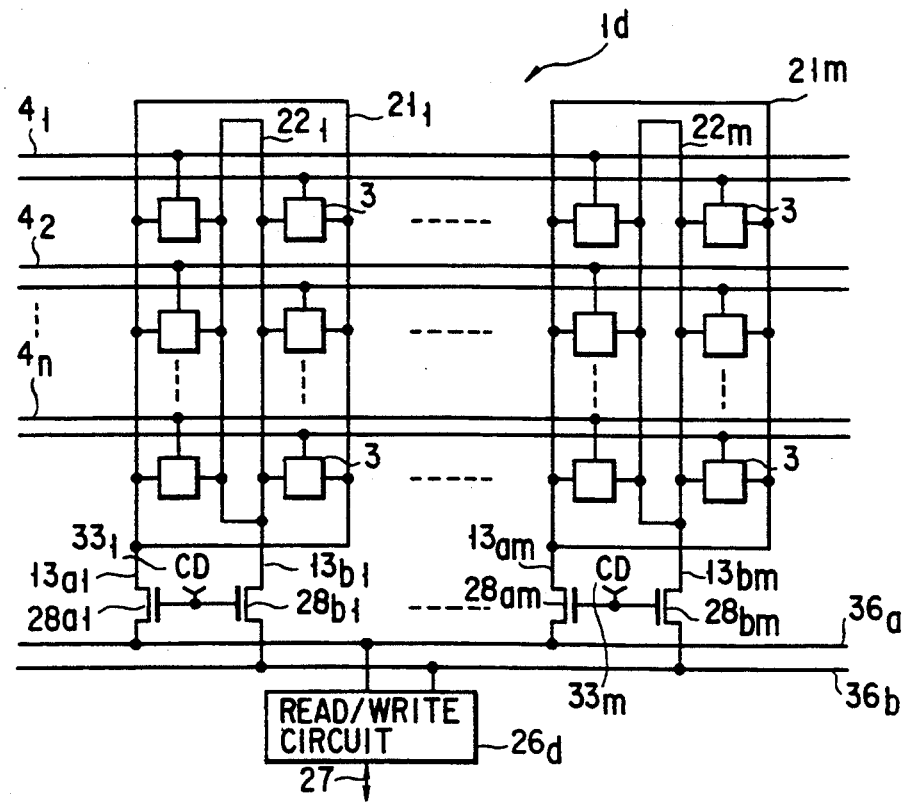
FIG. 7 is a schematic construction diagram of a memory cell array according to a fourth embodiment of the present invention in which a bit line constructed by a complementary signal line pair and connected to a read/write circuit via a transfer gate and data line has a ring-form portion.

FIG. 7 is a block diagram showing the schematic construction of a fourth embodiment of the present invention. In the fourth embodiment, each memory cell 3 has a pair of complementary signal lines like the memory cell in the SRAM and accordingly each bit line set is constituted by two bit lines. Also, in this case, like the second embodiment in FIG. 5 of the present invention, paired bit lines 13a, 13b have respective ring-form portions 21, 22, but instead of directly connecting the bit lines 13a, 13b to a read/write circuit 26d, one ends of the bit lines 13a, 13b are connected to one ends of respective transfer gates 28a, 28b. The other ends of the transfer gates 28a, 28b are connected through respective data lines 36a, 36b to the read/write circuit 26d. When a memory cell 3 is accessed, the transfer gates 28a, 28b are made conductive by a signal 33 from a column decoder (not shown).

Also, in the fourth embodiment, the same advantage can be attained by the same operation as that of the second embodiment of the present invention.

Figure 3:
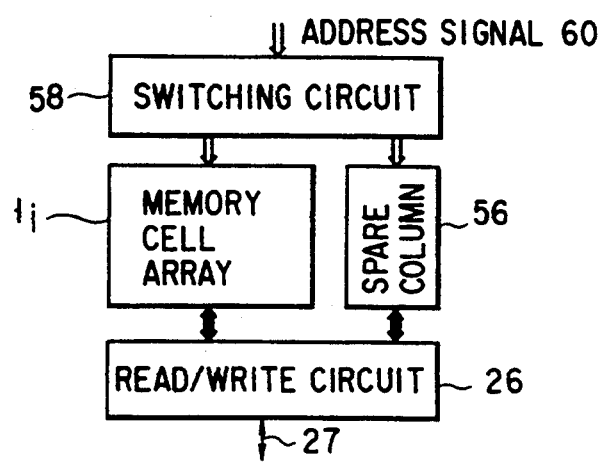
FIG. 3 is a schematic block diagram showing the construction of a semiconductor memory having a column redundant circuit additionally provided.

FIG. 8 is a block diagram showing a fifth embodiment of the present invention. The fifth embodiment is another embodiment wherein transfer gates 29a, 29b are used in the same manner as in the third embodiment in FIG. 3 of the present invention. As shown in FIG. 8, the semiconductor memory is constructed by memory cells 2, word lines 4, bit lines 13 and first and second transfer gates 29a, 29b which are regularly arranged, a data line 34 and a read/write circuit 26c. Every two of the word lines 4 are arranged together to extend in a lateral direction in FIG. 8. The bit line 13 is arranged in a U-shaped form such that the two branch portions thereof extend in an upward direction in FIG. 8 while crossing the word lines 4 and are connected together after crossing the uppermost word line 4_f in FIG. 8. One end of the bit line 13 is connected to one end of the current path of the first transfer gate 29a. The other end of the bit line 13 is connected to one end of the current path of the second transfer gate 29b. The other ends of the current paths of the first and second transfer gates 29a, 29b are connected to the common data line 34 which is connected to the read/write circuit 26c. Thus, a closed circuit is constructed by the bit line 13, the first and second transfer gates 29a, 29b, and part of data line 34. Half of the memory cells 2 associated with each of the bit lines 13 are arranged in an area defined by the U-shaped portion of the bit line and connected in a branch form to the left-side portion of the U-shaped portion 39. The remaining half of the memory cells 2 are arranged outside the area defined by the U-shaped portion and connected in a branch form to the right-side portion of the U-shaped portion 39. Thus, each of the memory cells 2 has two current paths leading to the read/write circuit 26c. The memory cells 2 are connected in a branch form to different word lines. The above layout patterns are regularly arranged in a lateral direction in FIG. 8. In the fifth embodiment, like the third embodiment in FIG. 6 Of the present invention, since a plurality of memory cells 2 are connected to the single read/write circuit 26c, the transfer gates 29a, 29b which are associated with a memory cell 2 to be accessed are made conductive by a signal 33 from a column decoder (not shown) when the memory cell 2 is accessed. The read/write circuit 26c reads or writes data from or into the memory cell 2 via a current path constructed by the bit line 13, transfer gates 29a, 29b set in the conductive state, and data line 34.

When the closed circuit containing the bit line 13 is thus formed, an advantage can be obtained that the memory function can be maintained even if breaking of wire occurs in one portion of the bit line 13. This is because one ring-form current path is formed by the U-shaped bit line 13, the first and second transfer gates 29a, 29b, and data line 34 when the first and second transfer gates 29a, 29b associated with a selected memory cell 2 are set in the conductive state. All of the memory cells associated with the bit line 13 are still electrically connected to the read/write circuit 26c even if the ring-form current path is opened at one portion by breaking of wire. This makes it possible to access any one of the memory cells. As long as the breaking of wire occurs only in one portion for each bit line, the memory function can be maintained even if a plurality of breakings of wire occur in different bit lines.

FIG. 9 is a block diagram showing a sixth embodiment of the present invention. Unlike the fifth embodiment in FIG. 8 of the present invention, in the sixth embodiment, a memory cell 3 has a complementary signal line pair like a memory cell in an SRAM. Every two bit lines constitute one bit line set. Both ends of the U-shaped bit line 14 are connected to transfer gates 30a, 31a which are both connected to a common data line 36a to construct a closed circuit 40. Another U-shaped bit line 15 is provided inside an area defined by the bit line 14 and creates a closed circuit 41 together with transfer gates 30b, 31b and a common data line 36b. The memory cells 3 are disposed between the bit lines 14 and 15, and respectively connected to different word lines 4 and a pair of bit lines 14 and 15. The data lines 36a and 36b are connected to a read/write circuit 26d.

Also, in the sixth embodiment, the same advantage can be attained by the same operation as that of the fifth embodiment of the present invention.

FIG. 10 is a block diagram showing a seventh embodiment of the present invention. The seventh embodiment has substantially the same structure as that of the first embodiment in FIG. 4 of the present invention. Both of the word lines and bit lines are formed to have ring-form portions. That is, every two of the word lines 6a, 6b or bit lines 16a, 16b constitute one word line pattern or one bit line pattern. A first word line 6a has a ring-form portion 10, and a second word line 6b has a ring-form portion 11. The ring-form portion 10 lies inside an area defined by the ring-form portion 11. A first bit line 16a has a ring-form portion 23, and a second bit line 16b has a ring-form portion 24. The ring-form portion 23 lies inside an area defined by the ring-form portion 24. A memory cell array 1g includes first to fourth memory cells S11 to S14 associated with the word lines 6a, 6b and the bit lines 16a, 16b. More particularly, the first memory cell S11 is disposed inside the area defined by the ring-form portion 10 and inside the area defined by the ring-form portion 23 and connected in a branch form to the word line 6a and the bit line 16a. The second memory cell S12 is disposed inside the area defined by the ring-form portion 10 and outside the area defined by the ring-form portion 24 and connected in a branch form to the word line 6a and the bit line 16b. The third memory cell S13 is disposed outside the area defined by the ring-form portion 11 and inside the area defined by the ring-form portion 23 and connected in a branch form to the word line 6b and the bit line 16a. The fourth memory cell S14 is disposed outside the area defined by the ring-form portion 11 and outside the area defined by the ring-form portion 24 and connected in a branch form to the word line 6b and the bit line 16b. Away patterns of a desired number which are the same as the above memory cell array 1g are repeatedly arranged in the row and column directions.

Also, in the seventh embodiment, as long as the breaking of wire occurs only in one portion foe each bit line or for each word line, the memory function can be maintained by the same effect as described before even if a plurality of breakings of wire occur in different bit lines or word lines.

Figure 11:
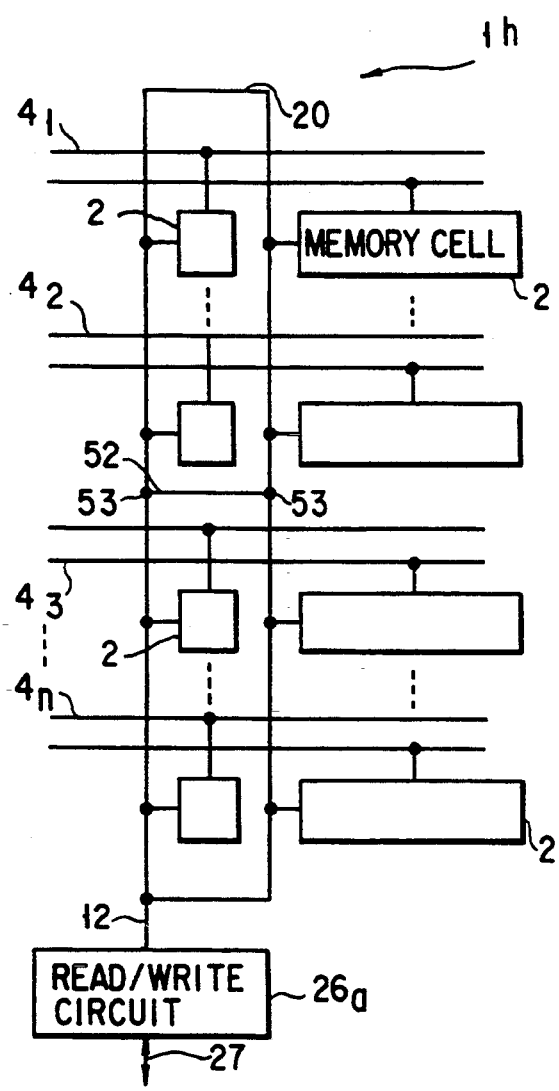
FIG. 11 is a schematic construction diagram of a memory cell array according to an eighth embodiment of the present invention in which a by-pass portion is added to a bit line and the bit line is formed to have a plurality of ring-form portions.

FIG. 11 is a block diagram showing an eighth embodiment of the present invention. The eighth embodiment has substantially the same structure as that of the first embodiment in FIG. 4 of the present invention. A by-pass portion 52 is added to the ring-form portion 20 of each bit line 12. In this case, even if breaking of wire occurs at two portions at maximum in one bit line 12 and either if the two breaking portions lie in the opposite positions on the bit line 12 with respect to the connection nodes 53 between the bit line 12 and the by-pass portion 52, or if breaking of wire occurs in one portion on the by-pass portion 52, the memory cell 2 can be kept electrically connected to the read/write circuit 26a and the memory function can be properly maintained. As the number of by-pass portions 52 is increased, occurrence of defect of the memory function caused by breaking of wire can be more effectively prevented.

Figure 12:
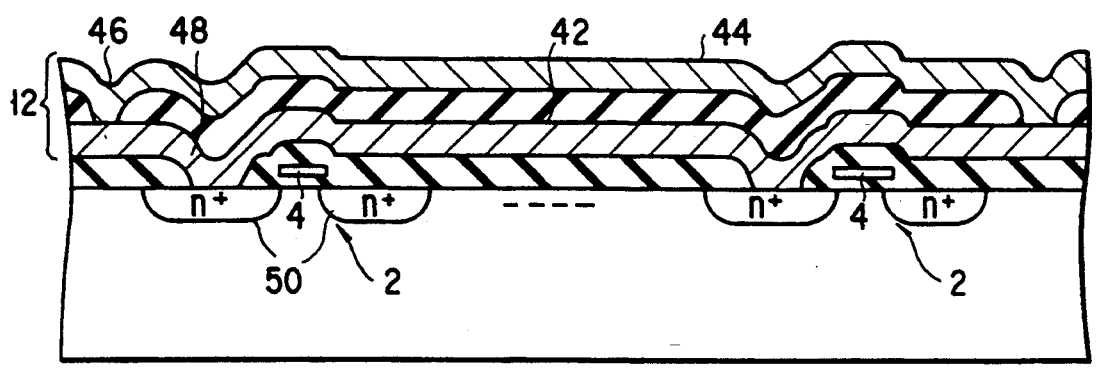
FIG. 12 is a schematic construction diagram of a memory cell array according to a ninth embodiment of the present invention in which the ring-form portion of a bit line is formed of two layered wirings.

FIG. 12 is a schematic diagram showing a memory cell array of a ninth embodiment of the present invention. FIG. 12 shows a cross section containing a central line of a linearly extending bit line for the sake of simplicity. Data holding section of the memory cell is not shown. For example, the bit line 12 shown in FIG. 4 is formed of a first wiring layer 42 and a second wiring layer 44. The first wiring layer 42 linearly extends and is made in contact with n+-type active regions 50 of a plurality of memory cells 2 via contact holes 48. The second wiring layer 44 is arranged in parallel to the first wiring layer 42 and made in contact with a plurality of portions of the first wiring layer 42 through via-holes 46 in FIG. 12. In each of the above embodiments, the ring-form current path is formed in the same plane, but in the ninth embodiment, the ring-form current path having a stacked structure in the vertical direction obtained by use of the first wiring layer 42, second wiring layer 44 and a plurality of via-holes 46 is formed. Also, in this case, the same effect as described before can be obtained. A reference numeral 4 indicates a lead wire.

Thus, the embodiments have been described with much attention paid to breaking of the bit line. However, according to the present invention, an adequate structure can be made to cope with not only breaking of the word line but also breaking of wire other than the word line and bit line so as to attain the same effect as described before.

In addition, the present invention can be applied to a memory in which the word line and/or bit line has a multiplex structure/divided structure, a memory in which the word lines cross the bit lines at an angle other than 90 degrees, a memory in which the read, write or erasing operation can be effected for a plurality of memory cells by one time of access, a memory in which a level shifter is series-connected between the word lines and the row decoder, and a memory in which data reading means is used instead of write/read means using the decoder.

Further, the present invention can be applied to all semiconductor memories such as DRAM, SRAM, mask ROM, PROM, OTPROM, EPROM, EEPROM, flash memory, image memory, associative memory, and cache memory.

Further, a redundant circuit may be provided in the present invention. The ring-form wiring in the present invention and the conventional redundant circuit are not incompatible with each other, but may rather produce a synergistic effect when used in combination. For example, a double back-up structure for breaking of wire can be attained by use of a combination of the ring-form wiring in the present invention and the conventional redundant circuit. A great effect may be attained by separately using the ring-form wiring of the present invention and the conventional redundant circuit for different functions.

Additional advantages and modifications will readily occur to those skilled in the art. Therefore, the present invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:
   a plurality of memory cells each specified by selecting one of rows and one of columns;
   a plurality of word lines to each of which said memory cells associated with selected one of the rows are connected in a branch form; and
   a plurality of bit lines to each of which said memory cells associated with selected one of the columns are connected in a branch form;
   wherein wiring of said bit lines constitutes part of at least one closed circuit.

2. A semiconductor memory device according to claim 1, wherein said memory cells are connected in a branch form to said closed circuit.

3. A semiconductor memory device according to claim 1, wherein a wiring portion other than said word lines and bit lines constitutes part of at least one closed circuit.

4. A semiconductor memory device according to claim 1, wherein part of said closed circuit is formed of said bit line and is formed in a paired configuration corresponding to complementary bit signals.

5. A semiconductor memory device according to claim 1, wherein said closed circuit is constructed by said bit line, transfer gates and a data line.

6. A semiconductor memory device comprising:
   a plurality of memory cells each specified by selecting one of rows and one of columns;
   a plurality of word lines to each of which said memory cells associated with selected one of the rows are connected in a branch form; and
   a plurality of bit lines to each of which said memory cells associated with selected one of the columns are connected in a branch form;
   wherein at least one closed circuit which is constructed by forming wiring of said bit lines to have an electrically closed ring-form portion is provided.

7. A semiconductor memory device according to claim 6, wherein said memory cells are connected in a branch form to said closed circuit.

8. A semiconductor memory device according to claim 6, wherein said ring-form portion is formed of said bit line and is formed in a paired configuration corresponding to complementary bit signals.

9. A semiconductor memory device comprising:
a plurality of memory cells each specified by selecting one of rows and one of columns;
a plurality of word lines to each of which said memory cells associated with selected one of the rows are connected in a branch form; and
a plurality of bit lines to each of which said memory cells associated with selected one of the columns are connected in a branch form;
wherein at least one closed circuit which is constructed by forming wiring of said bit lines to have an electrically closed ring-form portion is provided, and
wherein said ring-form portion is divided into a plurality of closed loops by at least one by-pass line.

10. A semiconductor memory device comprising:
a plurality of memory cells each specified by selecting one of rows and one of columns;
a plurality of word lines to each of which said memory cells associated with selected one of the rows are connected in a branch form;
first and second switching means for switching their conductivity;
a plurality of bit lines each series-connected at one ends to one end of said first switching means and to each of which said memory cells associated with selected one of the columns are connected in a branch form; and
a data line connected to the other end of said first switching means;
wherein the other end of at least one of said bit lines is series-connected to one end of said second switching means and the other end off said second switching means is connected to said data line so that at least one closed circuit can be constructed by said bit line, said first and second switching means and said data line.

11. A semiconductor memory device according to claim 10, wherein said switching means is constructed by a transfer gate.

12. A semiconductor memory device according to claim 10, wherein said memory cells are connected in a branch form to said closed circuit.

13. A semiconductor memory device according to claim 10, wherein a wiring portion other than said word lines and bit lines constitutes part of at least one closed circuit.

14. A semiconductor memory device according to claim 10, wherein said closed circuit is formed of said bit line and is formed in a paired configuration corresponding to complementary bit signals.

15. A semiconductor memory device comprising:
a plurality of memory cells each specified by selecting one of rows and one of columns;
a plurality of word lines to each of which said memory cells associated with selected one of the rows are connected in a branch form;
first and second switching means for switching their conductivity;
a plurality of bit lines each series-connected at one ends to one end of said first switching means and to each of which said memory cells associated with selected one of the columns are connected in a branch form; and
a data line connected to the other end of said first switching means;
wherein the other end of at least one of said bit lines is series-connected to one end of said second switching means and the other end of said second switching means is connected to said data line so that at least one closed circuit can be constructed by said bit line, said first and second switching means and said data line, and
wherein said closed circuit is divided into a plurality of closed loops by at least one by-pass line.

16. A semiconductor memory device according to claim 1, wherein said closed circuit comprises a first wiring layer formed linearly so as to contact with said memory cells through contact holes and a second wiring layer formed on and in parallel to said first wiring layer and being in contact with said first wiring layer through via-holes.

17. A semiconductor memory device according to claim 6, wherein said closed ring-form portion comprises a first wiring layer formed linearly so as to contact with said memory cells through contact holes and a second wiring layer formed on and in parallel to said first wiring layer and being in contact with said first wiring layer through via-holes.

18. A semiconductor memory device according to claim 10, wherein said closed circuit comprises a first wiring layer formed linearly so as to contact with said memory cells through contact holes and a second wiring layer formed on and in parallel to said first wiring layer and being in contact with said first wiring layer through via-holes.

* * * * *